(12) United States Patent
Lee

(10) Patent No.: US 7,615,777 B2
(45) Date of Patent: Nov. 10, 2009

(54) ORGANIC ELECTROLUMINESCENCE DEVICE INCLUDING AT LEAST ONE OF A HOLE INJECTION LAYER AND A HOLE TRANSPORT LAYER

(75) Inventor: Kyung Hoon Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 152 days.

(21) Appl. No.: 11/082,891

(22) Filed: Mar. 18, 2005

(65) Prior Publication Data
US 2005/0205864 A1 Sep. 22, 2005

(30) Foreign Application Priority Data
Mar. 19, 2004 (KR) .................. 10-2004-0018834

(51) Int. Cl.
H01L 35/24 (2006.01)
H01L 51/00 (2006.01)

(52) U.S. Cl. ........................................ 257/40
(58) Field of Classification Search .............. 257/40
See application file for complete search history.

(56) References Cited

U.S. PATENT DOCUMENTS

| 5,487,953 | A | * | 1/1996 | Shirota et al. ............... 428/690 |
| 5,792,557 | A | * | 8/1998 | Nakaya et al. ........... 428/411.1 |
| 2003/0180574 | A1 | * | 9/2003 | Huang et al. ................ 428/690 |

FOREIGN PATENT DOCUMENTS

| EP | 1 317 005 A2 | | 6/2003 |
| JP | 03-094258 | * | 4/1991 |
| JP | 07-301926 | * | 11/1995 |
| WO | WO 02/47457 A2 | | 6/2002 |
| WO | WO 03/105538 A1 | | 12/2003 |
| WO | WO 2004/016711 A1 | | 2/2004 |

OTHER PUBLICATIONS

English Translation of JP 03-094258.*
European Search Report ( Jun. 20, 2005).

* cited by examiner

Primary Examiner—Kenneth A Parker
Assistant Examiner—Anthony Ho
(74) Attorney, Agent, or Firm—Holland & Knight LLP

(57) ABSTRACT

The present invention provides an organic electroluminescence device, by which high brightness is provided in a manner of forming a hole injection or transport layer using a material that lowers an energy barrier. The present invention includes an organic emitting layer between a cathode and an anode and a hole injection and/or transport layer between the anode and the organic emitting layer, wherein at least one of the hole injection and transport layers has a configuration of Formula 1,

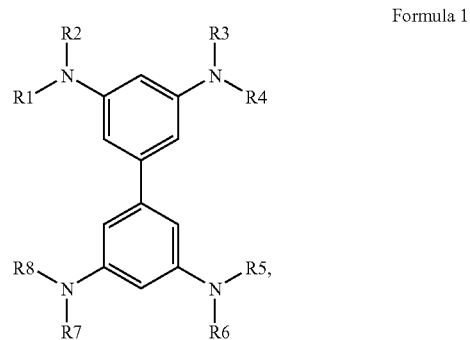

Formula 1 wherein each of the R1 to R8 is selected from an independently substituted or non-substituted aromatic group, a heterocyclic group, an aliphatic group and hydrogen.

2 Claims, No Drawings

ORGANIC ELECTROLUMINESCENCE DEVICE INCLUDING AT LEAST ONE OF A HOLE INJECTION LAYER AND A HOLE TRANSPORT LAYER

This application claims the benefit of the Korean Application No. 10-2004-0018834 filed on Mar. 19, 2004, which is hereby incorporated by reference.

BACKGROUND OF THE INVENTION

1. Field of the Invention

The present invention relates to an organic electroluminescence device which includes a hole injection or transport layer between a cathode and an anode.

2. Discussion of the Related Art

Recently, the demand for a flat panel display device occupying less area is rising according to the tendency of manufacturing a wide-screen display device.

A technology for an organic electroluminescence device, which may be called an organic light emitting diode (OLED), as one of the flat panel display devices has been rapidly developed. And, various prototypes were already released.

The organic electroluminescence device is a device emitting light in a following manner, First of all, if electric charges are injected in an organic layer between a cathode and an anode, a pair of electron and hole is formed to disappear. While disappearing, the electron/hole pair emits light.

Hence, the organic electroluminescence device, which can be formed on a flexible transparent substrate like plastics, is drivable at a voltage (below 10V) lower than that of a plasma display panel (PDP) or an inorganic electroluminescence (EL) display.

The organic electroluminescence device needs relatively low power consumption and provides the excellent color sense.

In order to drive the organic electroluminescence device at low voltage, it is important to maintain very thin and uniform thickness (100~200 nm) of the organic layer and stability of the device.

In providing high efficiency to the organic electroluminescence device, it is important to sustain density balance between holes and electrons.

For instance, if an electron transport layer (ETL) is situated between an emitting layer (EML) and a cathode, most of the electrons injected in the emitting layer from the cathode move toward the anode to be recombined with holes.

Yet, if a hole transport layer (HTL) is inserted between the anode and the emitting layer, the electrons injected in the emitting layer are blocked by an interface of the hole transport layer. If so, the electrons are unable to further proceed to the anode but remains in the emitting layer only. Hence, recombination efficiency is enhanced.

Meanwhile, a hole injection layer (HTL) is additionally inserted between the anode and the hole transport layer.

If an organic substance having a work function of 5.0~5.2 eV is selected by considering a work function (4.7~5.0 eV) of the anode and ionization potential (IP) of the hole transport layer, an energy barrier in hole injection from the anode to the hole transport layer is lowered to enable efficient hole injection.

A process of fabricating an organic EL device is explained as follows.

(1) First of all, an anode material is coated on a transparent substrate. ITO (indium tin oxide) is usually used as the anode material.

(2) A hole injection layer (HIL) is coated on the anode material. Copper phthalocyanine (CuPC) as the hole injection layer is mainly coated 10~30 nm thick thereon.

(3) A hole transport layer (HTL) is introduced. (4,4'-bis[N-(1-naphthyl)-N-phenthylamino]-biphenyl(NPB) as the hole transport layer is deposited 30~60 nm thick.

(4) An organic emitting layer is formed thereon. In doing so, a dopant is added thereto if necessary. In case of green emission, $Alq_3$ (tris(8-hydroxy-quinolatealuminum)) as the organic emitting layer is deposited 30~60 nm thick. And, MQD (N-Me thylquinacridone) is mainly used as the dopant.

(5) An electron transport layer (ETL) and an electron injection layer (EIL) are sequentially coated thereon or an electron injection transport layer is formed. In case of green emission, the electron injection/transport layer is not usually used since $Alq_3$ in (4) has sufficient electron transport ability.

(6) A cathode is coated thereon. And, a protecting layer is finally formed thereon.

However, the related art device needs a material lowering the energy barrier in hole injection to effectively inject holes.

SUMMARY OF THE INVENTION

Accordingly, the present invention is directed to an organic electroluminescence device that substantially obviates one or more problems due to limitations and disadvantages of the related art.

An object of the present invention is to provide an organic electroluminescence device, by which high brightness is provided in a manner of forming a hole injection or transport layer using a material that lowers an energy barrier.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electroluminescence device according to the present invention includes an organic emitting layer between a cathode and an anode and a hole injection and/or transport layer between the anode and the organic emitting layer, wherein at least one of the hole injection and transport layers has a configuration of Formula 1,

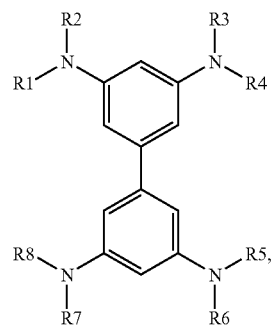

Formula 1 wherein each of the R1 to R8 is selected from an independently substituted or non-substituted aromatic group, a heterocyclic group, an aliphatic group and hydrogen.

It is to be understood that both the foregoing general description and the following detailed description of the present invention are exemplary and explanatory and are intended to provide further explanation of the invention as claimed.

BRIEF DESCRIPTION OF THE DRAWINGS

None

DETAILED DESCRIPTION OF THE INVENTION

Reference will now be made in detail to the preferred embodiments of the present invention.

An organic electroluminescence device according to the present invention can be formed by sequentially stacking an anode, a hole injection layer, a hole transport layer, an organic emitting layer, an electron transport layer, an electron injection layer and a cathode.

In this case, at least one of the hole injection and transport layers can be formed of the material having the configuration of Formula 1.

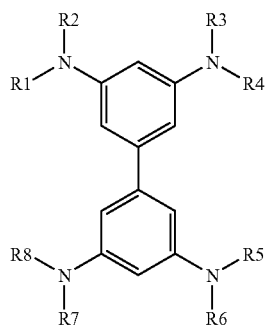

[Formula 1]

In Formula 1, each of the R1 to R8 can be selected from an independently substituted or non-substituted aromatic group, a heterocyclic group, an aliphatic group and hydrogen.

Specifically, each of the R1 to R8 can be selected from substituted or non-substituted phenyl, biphenyl, pyridyl), naphthyl, quinolyl, isoquinolyl, fluorenyl, terphenyl, anthryl, phenanthryl, methyl, ethyl, propyl, i-propyl, t-butyl and hydrogen.

And, each substituent functional group of the R1 to R8 can be selected from the group consisting of alkyl, aryl, alkoxy, halogen, cyano and the like.

For instance, each substituent functional group of the R1 to R8 can be selected from the group consisting of methyl, ethyl, propyl, i-propyl, t-butyl, cyclohexyl, methoxy, ethoxy, propoxy, butoxy, phenoxy, tolyloxy, F, Cl and cyano.

And, the hole injection or transport layer can have the following configuration shown in Formula 2.

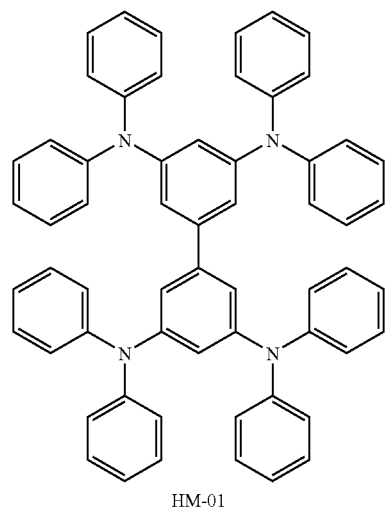

[Formula 2]

HM-01

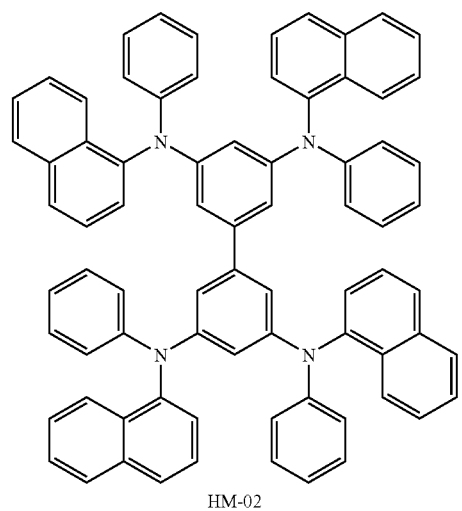

HM-02

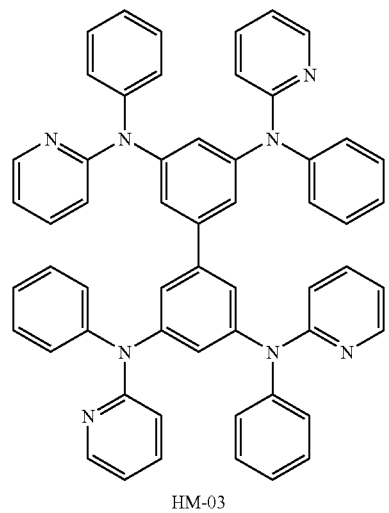

HM-03

-continued
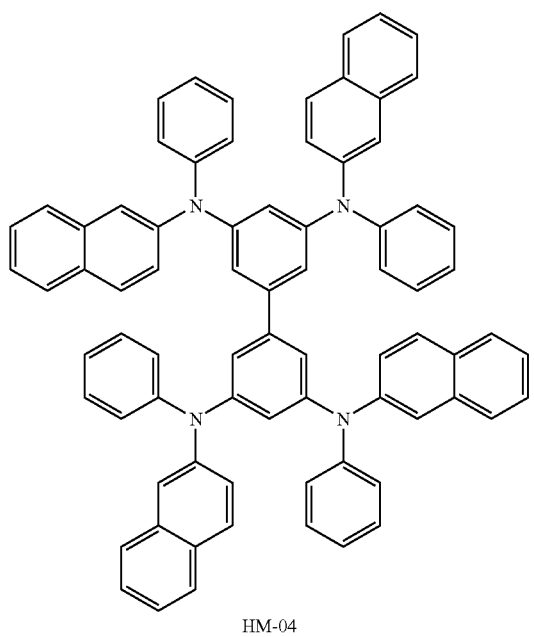
HM-04
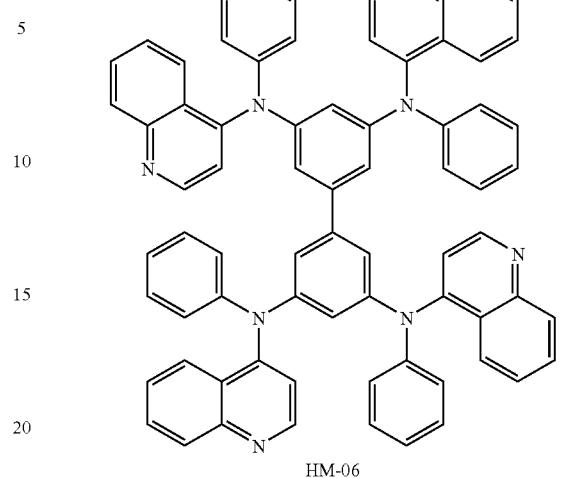
HM-06
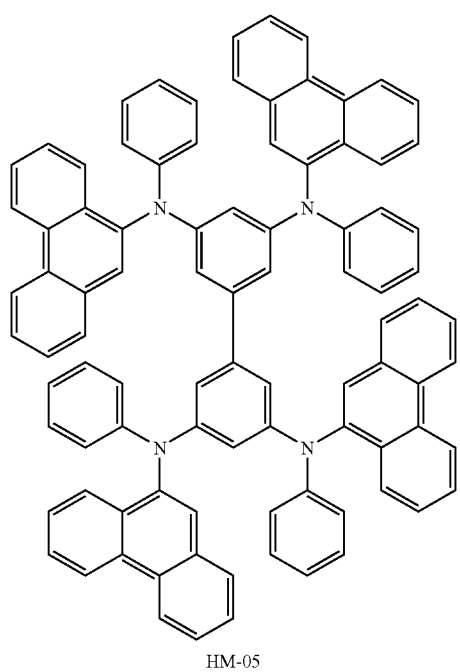
HM-05
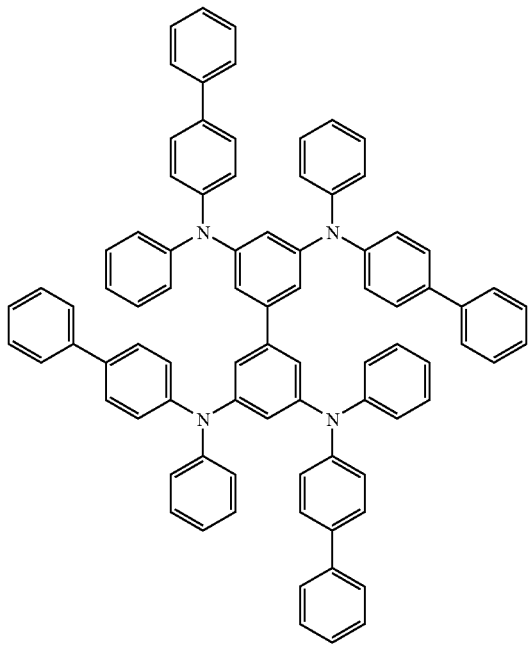
HM-07

-continued
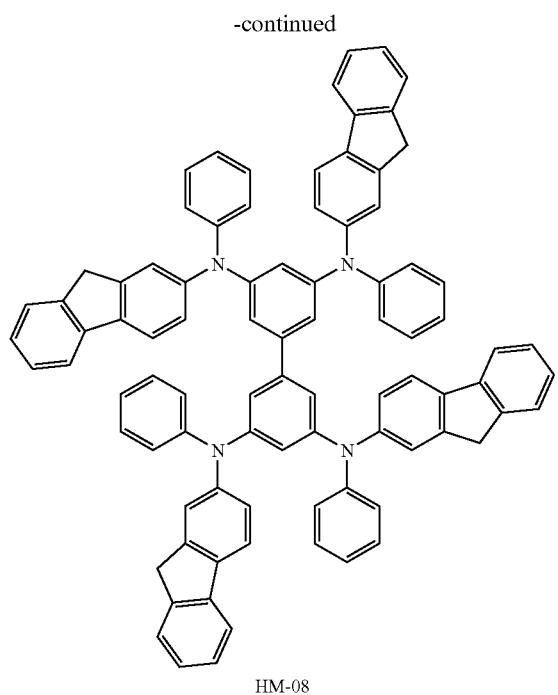
HM-08
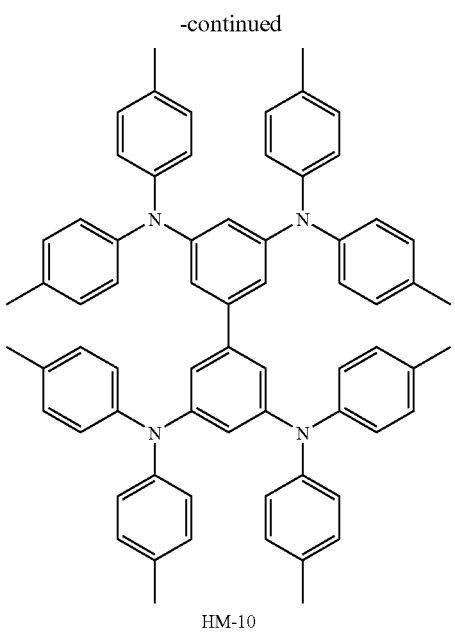
HM-10
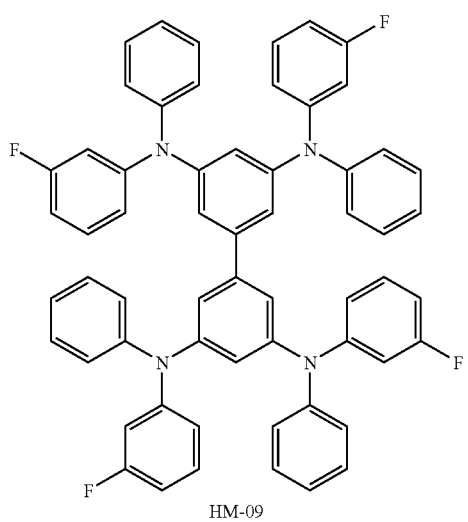
HM-09
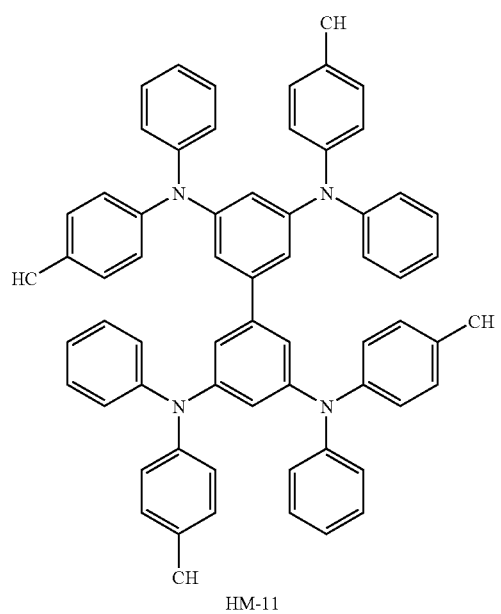
HM-11

-continued
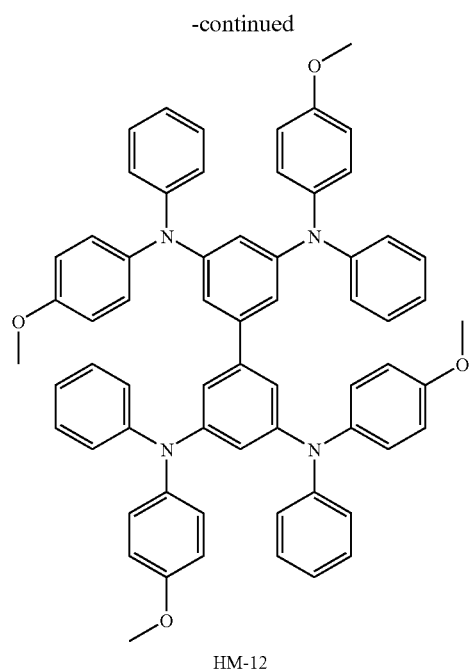
HM-12
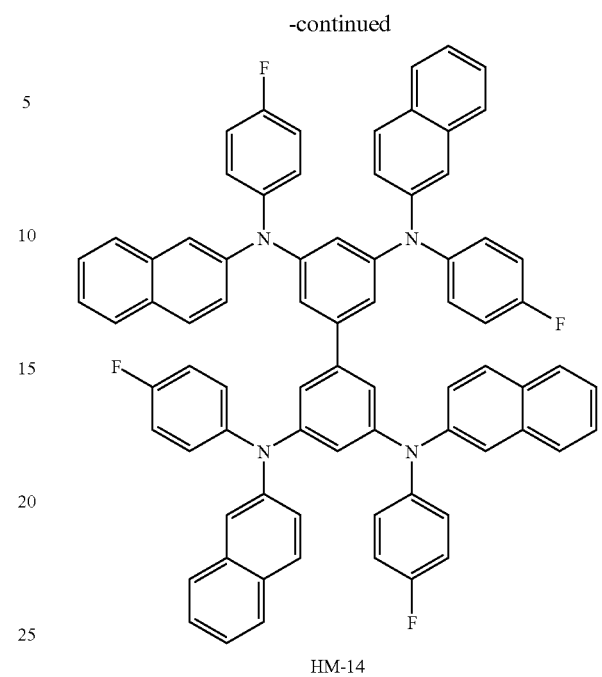
HM-14
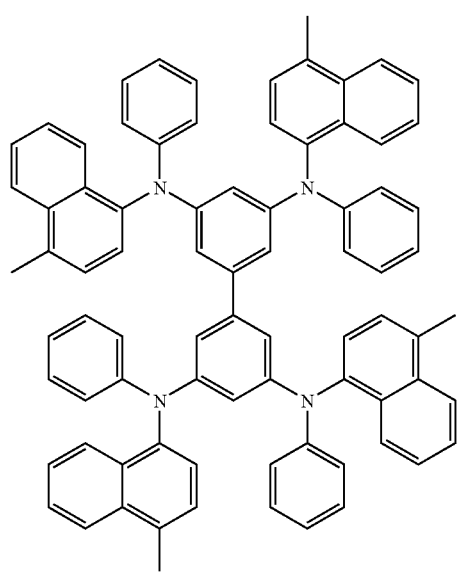
HM-13
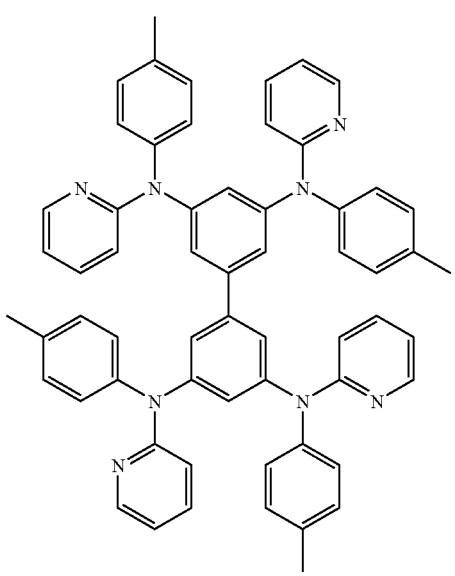
HM-15

-continued

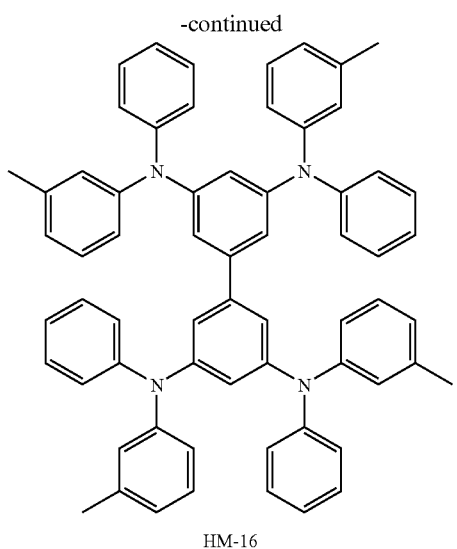

HM-16

In the organic electroluminescence device according to the present invention, $N^3,N^3,N^5,N^{5'},N^{3'},N^{3'},N^{5'},N^{5'}$-octaphenyl-biphenyl-3,5,3',5'-tetraamine (HM-01) used as the hole injection or transport layer is synthesized in a following manner.

1. Synthesis of 3,5,3',5'-tetrabromo-biphenyl

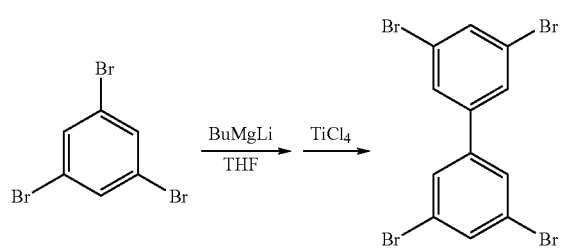

1.

First of all, tributylmagnesiumchloride)(8.73 mL,0.017 mol) is mixed with THF (50 mL) in a round-bottom 2-neck flask. And, 2.5M n-BuLi (14.0 mL, 0.035 mol) is slowly dropped in the flask at 0° C. The flask is then agitated for 10 minutes to form tributylmagnesium lithium.

1,3,5-tribromobenzene(10 g, 0.031 mol) is dissolved in THF (50 mL), the prepared tributylmagnesium lithium is slowly dropped at −40° C., and agitation is performed thereon for 50 minutes. Subsequently, titanium chloride (3.4 g, 0.021 mol) is dropped thereon to be stirred for two hours at 0° C.

After completion of the reaction, the resultant is dropped in $NH_4Cl$ solution (100 mL) to be agitated for 30 minutes. And, extraction is performed with ethyl acetate.

Re-crystallization is carried out on the extracted solution in ethanol and filtration is performed thereon to obtain white solid product of 3,5,3',5'-tetrabromo-biphenyl(4.0 g, 50%).

2. Synthesis of $N^3,N^3,N^5,N^5,N^{3'},N^{3'},N^{5'},N^{5'}$-Octaphenyl-biphenyl-3,5,3',5'-tetraamine(HM-01)

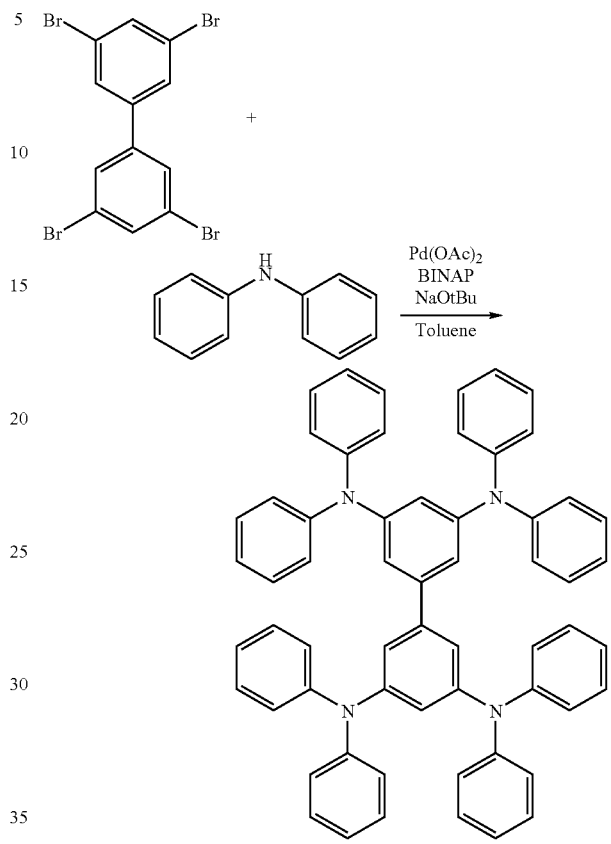

1.

In a round-bottom 2-neck flask, 3,5,3',5'-tetrabromo-biphenyl (2 g, 0.0043 mol), diphenylamine (5.8 g, 0.034 mol), BINAP(2.2'-Bis(diphenylphosphino)-1,1'-binaphthyl)(0.53 g, 0.85 mmol), $Pd(OAc)_2$(palladium acetate)(0.1 g, 0.44 mmol) and NaO'Bu(Sodium tert-butoxide)(4.1 g, 0.043 mol) are dissolved in toluene (100 mL) and agitation is performed thereon for 24 hours at 100° C.

Once the reaction is terminated, vacuum distillation is carried out to remove toluene. And, recrystallization is carried out using toluene and methanol. Filtration is then carried out to obtain white solid product of HM-01 (2.35 g, 67%).

An organic electroluminescence device according to a preferred embodiment of the present invention is explained as follows.

EMBODIMENT

An ITO (indium tin oxide) substrate (glass) is patterned to have an emitting size of 3 mm×3 mm. And, a cleaning process is carried out on the patterned substrate.

Subsequently, after the substrate has been loaded in a vacuum chamber, basic pressure of $1 \times 10^{-6}$ torr is sustained therein. And, organic substance layers are formed on the ITO substrate in order of a hole injection layer (600 Å), a hole transport layer (400 Å), an emitting layer (200 Å), $Alq_3$ (400 Å), LiF (5 Å) and A (1,000 Å).

Embodiment 1

HM-01 and NPB are used as hole injection and transport layers, respectively. If a current of 1 mA is applied, a drive voltage is 10.3V and brightness is 2,330 cd/m². In this case, CIE (Commission Internationale de L'Eclairage) has x=0.335 and y=0.622.

Embodiment 2

CuPc and HM-01 are used as hole injection and transport layers, respectively. If a current of 1 mA is applied, a drive voltage is 9.4V and brightness is 2,305 cd/m². In this case, CIE has x=0.356 and y=0.613.

COMPARISON EXAMPLE

CuPc and NPB are used as hole injection and transport layers, respectively. If a current of 1 mA is applied, a drive voltage is 8.5V and brightness is 1,541 cd/m². In this x=0.351 and y=0.612. Chemical formula of CuPC, NPB and $Alq_3$ are shown in Formula 3.

[Formula 3]

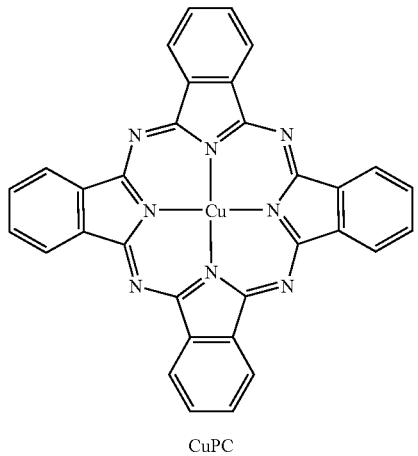

CuPC

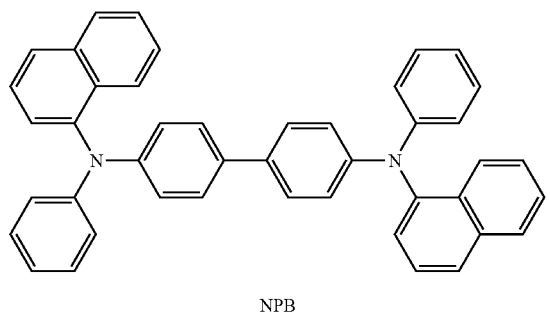

NPB

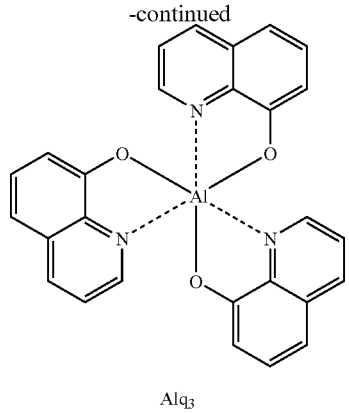

$Alq_3$

Accordingly, the organic electroluminescence device according to the present invention includes at least one of the hole injection and transport layers between the anode and cathode. And, the hole injection OT transport layer is formed of the substance having the configuration shown in Formula 1. Therefore, by the present invention, the organic electroluminescence device of high brightness can be fabricated.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic electroluminescence device comprising:
   an organic emitting layer between a cathode and an anode; and
   a hole injection and/or transport layer between the anode and the organic emitting layer, wherein at least one of the hole injection and transport layers has a configuration of Formula 1, Formula 1

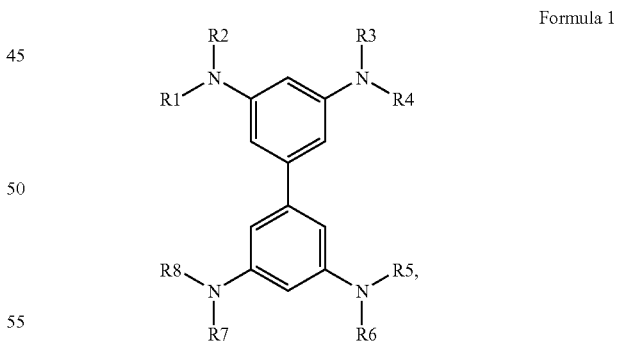

wherein each of the R1 to R8 is selected from an independently substituted or non-substituted aromatic group, a heterocyclic group, an aliphatic group, wherein at least one of the R1 to R8 is selected from the group consisting of substituted or non-substituted pyridyl, quinolyl, isoquinolyl, fluorenyl, terphenyl, anthryl, phenanthryl, cyclohexyl, phenoxy, tolyloxy, and cyano.

2. The organic electroluminescence device of claim 1, wherein at least one of the hole injection and transport layers has at least one of the following configurations:

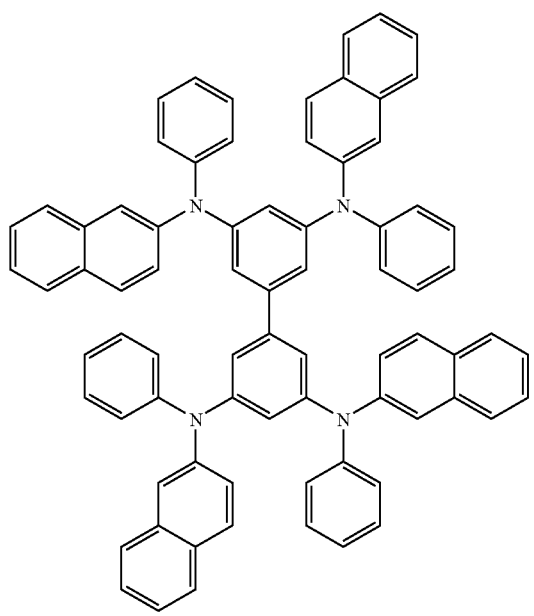
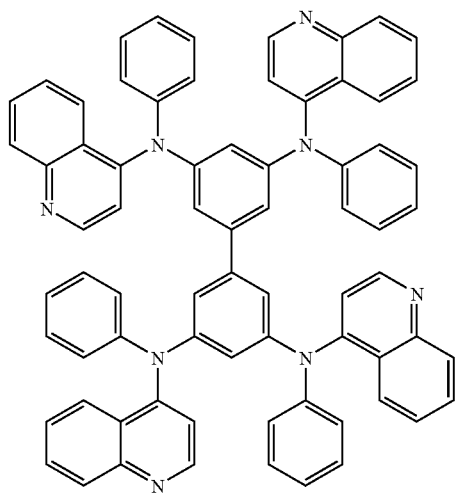
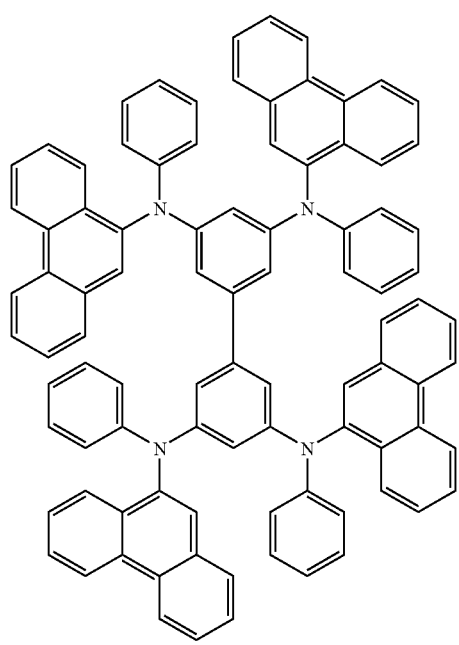
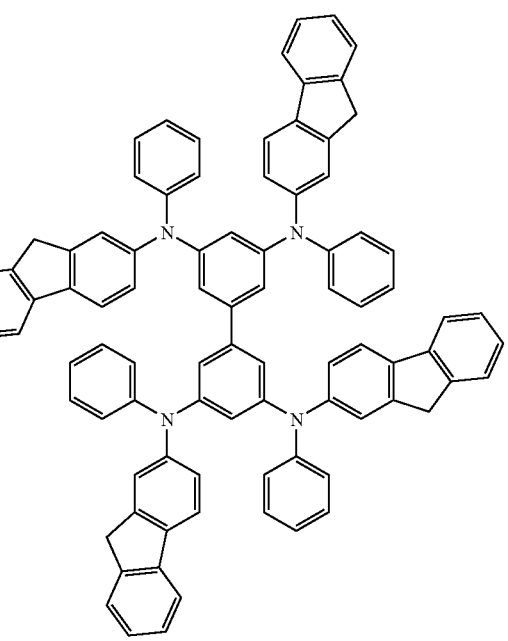

-continued
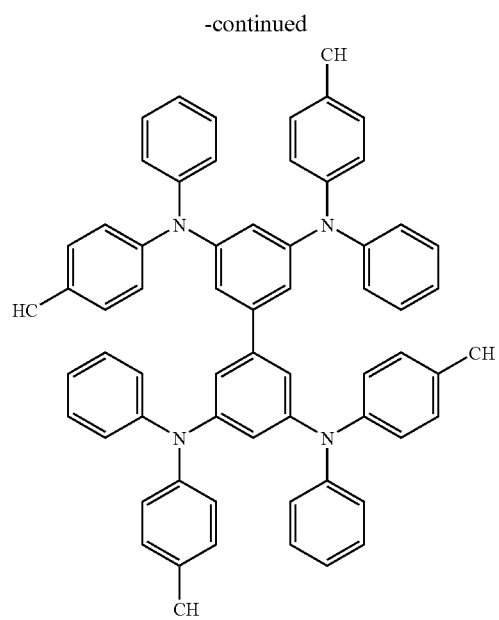
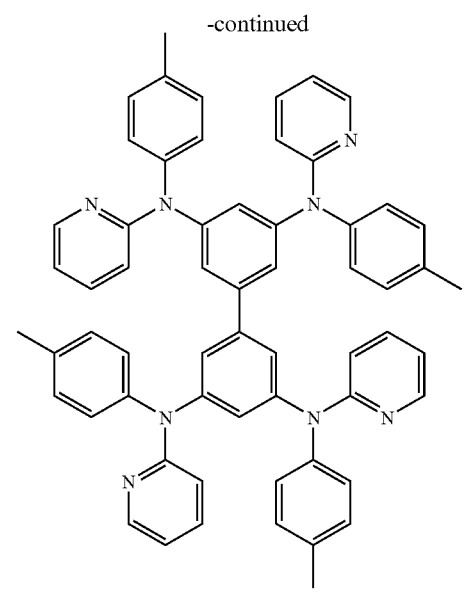
* * * * *